United States Patent [19]

Schutrum et al.

[11] Patent Number: 4,803,484
[45] Date of Patent: Feb. 7, 1989

[54] OPTICALLY READABLE AND HUMAN READABLE DIAL

[75] Inventors: Walter L. Schutrum; Thomas L. Jay, both of Kettering, Ohio

[73] Assignee: Energy Innovations, Inc., Dayton, Ohio

[21] Appl. No.: 4,551

[22] Filed: Jan. 16, 1987

[51] Int. Cl.⁴ .................... G08B 23/00; G08C 15/06
[52] U.S. Cl. .................... 340/870.02; 324/96
[58] Field of Search ........ 340/870.02, 870.01, 340/310 A, 870.03, 815.05, 815.07, 815.08, 810; 324/142, 114, 142, 154 R, 96, 116; 235/39, 103; 116/334, 335, 284, D31, D46

[56] References Cited

U.S. PATENT DOCUMENTS

| | | | |
|---|---|---|---|
| 2,610,275 | 9/1952 | Butterfield | 116/334 |
| 4,015,253 | 3/1977 | Goldstein | 340/810 |
| 4,500,870 | 2/1985 | Krohn et al. | 340/347 P |
| 4,646,084 | 2/1987 | Burrowes et al. | 340/870.03 |

Primary Examiner—John W. Caldwell, Sr.
Assistant Examiner—Tyrone Queen
Attorney, Agent, or Firm—Killworth, Gottman, Hagan & Schaeff

[57] ABSTRACT

A utility meter reading system permits reading a meter with a noncontact shaft angle detector and simultaneous visual inspection of the dials of the meter from a laterally spaced viewing position. Each of the dials defines a patterned disc for concentric rotation with the shaft and a beveled circumferential surface which extends around the patterned disc and bears a plurality of numerical indicia. The dials are configured to be adhesively mounted over dial pointers on an existing utility meter, thus permitting retrofitting of meters with noncontact shaft angle detectors.

14 Claims, 6 Drawing Sheets

OPTICALLY READABLE AND HUMAN READABLE DIAL

BACKGROUND OF THE INVENTION

The present invention relates to a utility meter reading system for use with a meter which measures the consumption or use by a consumer of a metered commodity or service and, more particularly, to such a system including a dial arrangement which permits the meter to be read by a noncontact shaft angle detector and, simultaneously, visually read by the consumer or by a utility company employee.

It has long been recognized that automated reading of utility company meters, such as electric and gas utility meters, would be highly desirable. One of the major obstacles to implementing automated meter reading systems has been the relatively high cost of the meter reading apparatus which must be provided for each meter to be read. In a typical electric or gas utility system having thousands of meters, minimizing individual meter apparatus costs is essential to an economically viable automated reading system, and the ability to retrofit existing meters is highly desirable. Converting the large number of existing utility meters to automatic meter reading capability with minimum modification to the meters has presented substantial difficulties.

Disclosed in U.S. patent application Ser. No. 747,243, filed June 21, 1985, entitled Meter Reading Methods and Apparatus, by Burrowes, now U.S. Pat. No. 4,646,084, issued Feb. 24, 1987, and assigned to the assignee of the present invention, is an improved automated meter reading device which permits a meter to be retrofitted with minimal changes to the meter structure. A noncontact shaft angle detector arrangement optically reads the angular positions of the meter dial shafts, thus eliminating the need for any mechanical modification to the meter mechanism or mechanical coupling between the meter and the reading apparatus which is added to the existing meter structure. A patterned disc is mounted for rotation with each of the dial pointers and indicator shafts. The patterned discs are illuminated in sequence and their orientations are read by a sensor. The angular positions of the indicator shafts are determined in this manner to provide a complete reading of the meter. Output signals are then produced by the electronics to transmit the meter readings and other information to remote locations. This meter reading system is superior to prior art systems since it may easily be coupled to known, dependable meter mechanisms without requiring significant mechanical modifications to the mechanisms beyond the addition of the patterned discs. Additionally, such a meter reading arrangement can be added to existing meters in the field, retrofitting them in a simple, economical fashion to form a part of the automated meter reading system.

In the meter reading arrangement disclosed in the application Ser. No. 747,243 the radiant energy sensor arrangement, including energy source and optics, is mounted close to the patterned discs and dial pointers, making visual reading of the meter somewhat difficult. A viewing window to permit visual inspection of the meter is necessarily provided to one side of the row of discs and dial pointers, providing an oblique viewing angle.

Accordingly, there is a need for a utility meter reading system, including a dial arrangement which may be monitored by a noncontact shaft angle detector and simultaneousy visually inspected.

SUMMARY OF THE INVENTION

These needs are met by a utility meter reading system according to the present invention which includes meter means, a plurality of dial means, and a noncontact shaft angle detector. The meter means measures the consumption of a metered utility service by a consumer, includes a plurality of indicator shafts, the angular positions of which visually indicate consumption. A plurality of dial means are mounted for rotation on associated ones of the indicator shafts. Each dial means defines a patterned disc for concentric rotation with a shaft, and a beveled circumferential surface extending around the patterned discs and bearing a plurality of numerical indicia. The noncontact shaft angle detector, mounted adjacent the dial means, detects the angular positions of the patterned discs. The detector is mounted adjacent the dial means. The angular position of each dial means is viewable with ease from a lateral viewing position by the consumer by virtue of the orientation of the numerical indicia on the beveled surface.

The dial means may be configured to be adhesively mounted over a dial pointer on an indicator shaft so as to retrofit a utility meter with the dial means and the noncontact shaft angle detector. The patterned disk may be diametrically bisected into two sectors of differing optical properties.

The meter means may define a face plate through which the indicator shafts extend and on which a plurality of face indicia are arranged around each of the shafts to indicate the position of the dial pointers carried by the shafts. The dial means have a sufficient outer diameter to cover the face indicia. The face plate preferably carries a positional indicator for each of the dial means to provide an indication of a shaft angle position in conjunction with the numerical indicia. Some of the shafts may rotate generally clockwise with increasing consumption and the numerical indicia are arranged in ascending order in a counterclockwise direction around the periphery of the dial means mounted on these shafts. Others of the shafts may rotate generally counterclockwise with increasing consumption and the numerical indicia are arranged in ascending order in a clockwise direction around the periphery of the dial means mounted on these shafts.

The utility meter reading system may further comprise a cover defining a visual inspection window which provides clear lines of sight to the plurality of dial means along lines generally perpendicular to the closest portion of the beveled surfaces of the dial means, whereby the numerical indicia on the dial means may be easily viewed. The utility meter reading system may additionally comprise a position indicator on the face plate for each of the dial means, whereby the angular position of each of the shafts is clearly defined. The dial means may be arranged in a row across the face plate, with the window being generally laterally positioned with respect thereto to facilitate visual inspection of the dial means.

The dial for retrofitting a utility meter to permit automated optical detection of the position of an indicator shaft carrying a dial pointer and visual inspection of the position of the indicator shaft includes a dial body, defining a mounting surface having a pointer receiving recess therein for mounting on the dial pointer, a generally flat surface on the side of the body opposite the mounting surface, and a beveled surface extending circumferentially therearound. An optically readable pattern is provided on the generally flat surface. A plurality of numerical indicia are provided on the beveled surface for visual inspection, whereby the optically readable pattern may be read by a noncontact shaft angle detector and the numerical indicia may simultaneously be viewed from a lateral position.

The numerical indicia may be arranged in ascending order in a counterclockwise direction around the periphery of the dial. Alternatively, the numerical indicia may be arranged in ascending order in a clockwise direction around the periphery of the dial. The dial may be sufficiently large in diameter so as to cover any indicia on the face plate of the meter associated with the pointer.

Accordingly, it is an object of the present invention to provide a meter reading system including a dial, the orientation of which may be determined by a noncontact shaft angle detector positioned generally in alignment with the shaft carrying the dial, and which dial simultaneously may be visually read with ease from an oblique viewing angle; to provide such a system and dial in which retrofitting of existing meters may be facilitated; and to provide such a system and dial in which the dial is configured to be affixed to a shaft of a meter and cover any indicia on the face of the meter associated with the pointer.

Other objects and advantages of the invention will be apparent from the following description, the accompanying drawings and the appended claims.

DETAILED DESCRIPTION OF THE PREFERRED EMBODIMENTS

Figure 1:
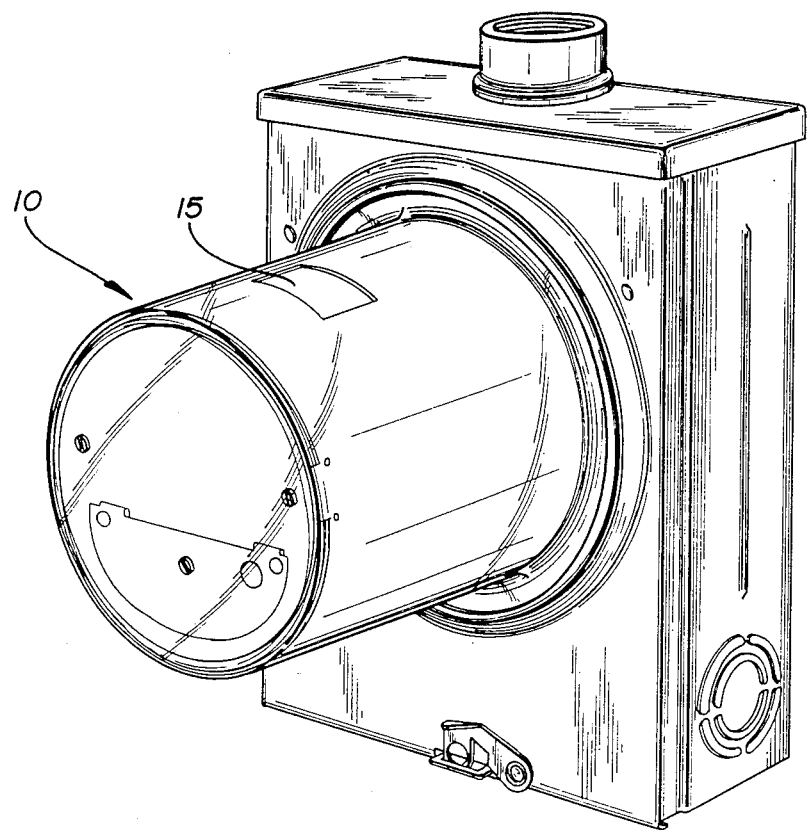
FIG. 1 is a perspective view of a meter constructed according to the present invention.
Figure 2:
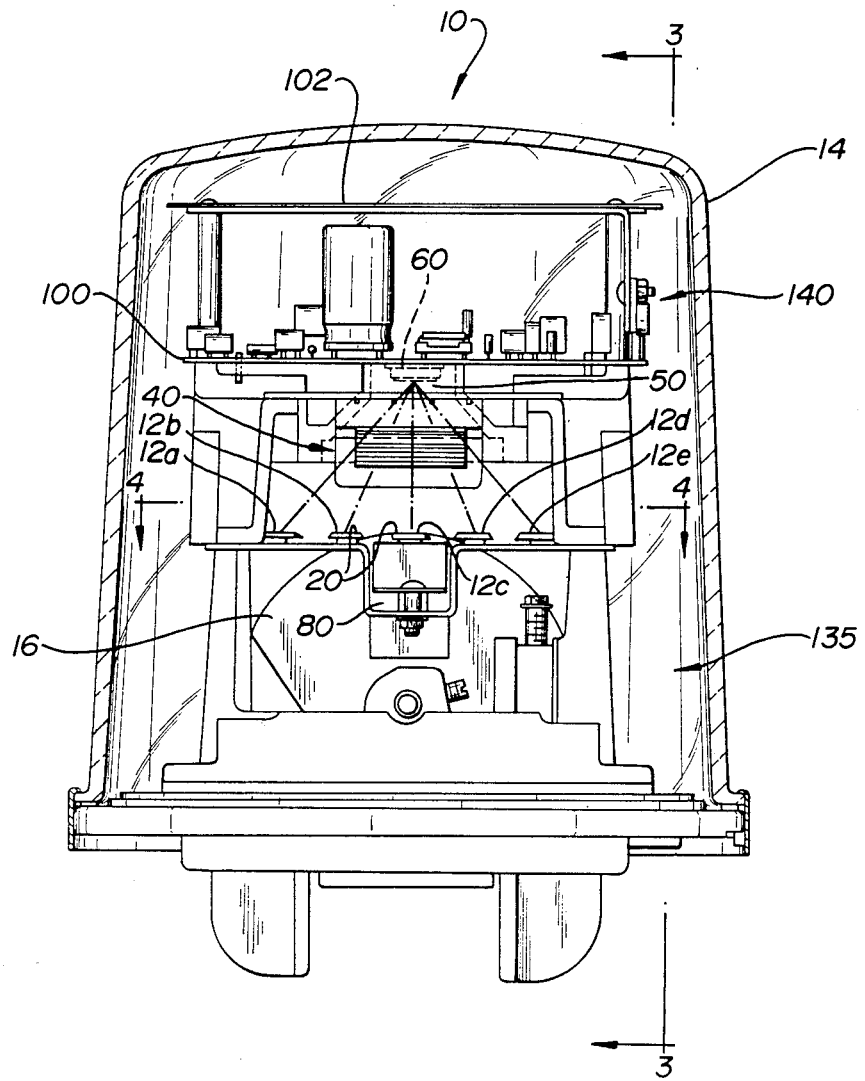
FIG. 2 is a partial sectional plan view of an illustrative electric utility meter, modified in accordance with the present invention.
Figure 3:
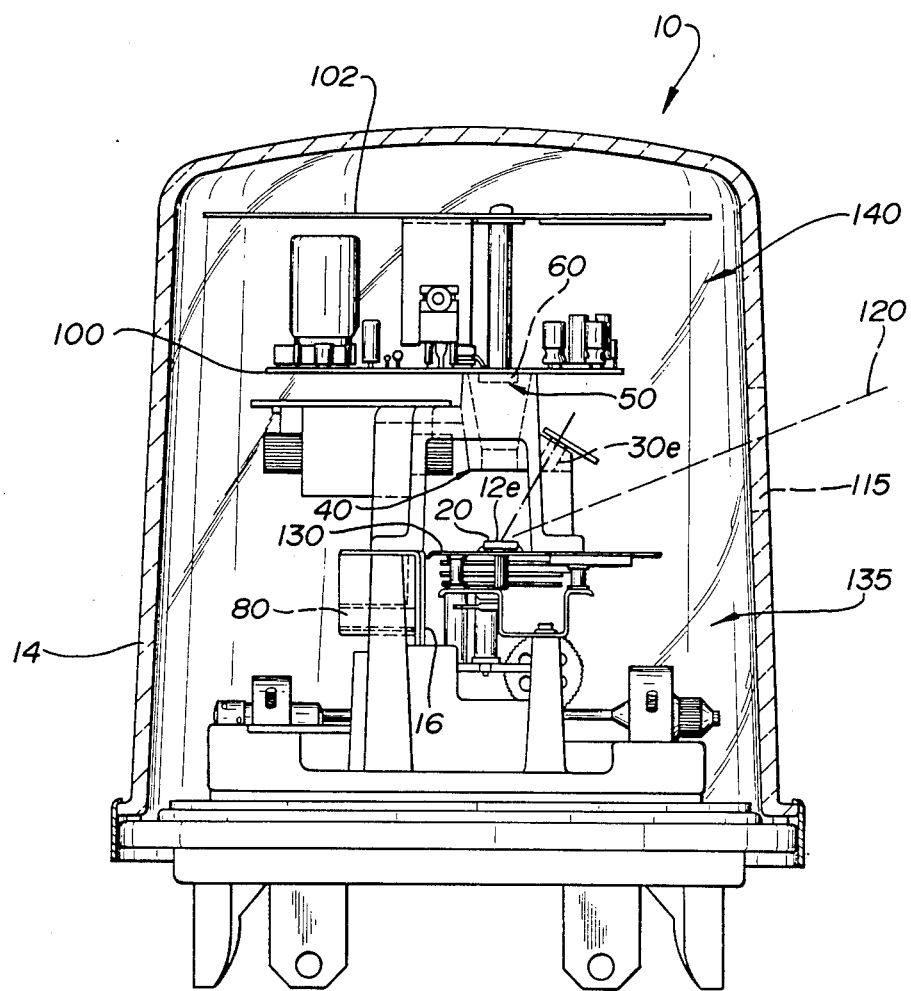
FIG. 3 is a side view of the meter of FIG. 2, taken generally along line 3—3 in FIG. 2.

Shown in FIGS. 1, 2 and 3 is a meter reading system constructed according to the present invention, including a meter means 135 for measuring the consumption of a metered utility service or commodity by a consumer, such as for example electrical power. The illustrated meter means 10, in this case a watt hour meter, includes a plurality of a rotating dial means 12a–e constructed according to the present invention for indicating the amount of electrical energy consumed in the circuit monitored by the meter. The five dials are affixed to indicator shafts 110 (FIG. 8), the angular positions of which indicate watt hour consumption in a 5-digit decimal number, as measured by the meter 135. It will be understood, of course, that the meter could have any number of such dials.

As will be discussed in greater detail below, affixed to each dial 12 is a patterned disc 20 of the type shown in commonly assigned Burrowes et al U.S. patent application Ser. No. 624,156, filed June 25, 1984, now U.S. Pat. No. 4,587,513, issued May 6, 1976. In the depicted embodiment, each disc 20 is circular and is mounted on the associated dial 12 for concentric rotation therewith.

A noncontact shaft angle detector 140 detects the angular positions of the discs 20 and provides an indication of energy consumption, thus obtained, to a remote location in a manner described more fully in U.S. patent application Ser. No. 747,243, filed June 21, 1985, by Burrowes, entitled NONCONTACT SHAFT ANGLE DETECTOR, assigned to the assignee of the present invention. A plurality of radiant energy sources 30a–e, only one of which is visible in FIG. 3, are mounted in front of discs 20 so that radiant energy from each source 30 is directed to a respective one of the discs 20. Sources 30 may be infrared light emitting diodes which are energized in a predetermined sequence. Because of the differing radiant energy attenuation properties of different sections of the discs 20, the radiant energy reflected by each discs encodes the angular position of the meter shaft upon which it is mounted, as taught by the Burrowes et al patent application Ser. No. 624,156.

Radiant energy reflected by each disc 20 is directed to a single sensor 60 at location 50 by a plurality of lenses 40, each of which is disposed along an axis between the respective one of discs 20 and sensor location 50. Accordingly, the angular position of each of the dials 12 and discs 20 are checked in sequence to produce a complete reading of the meter.

It should be noted that everything which is to be added to the conventional meter apparatus in accordance with the invention can typically be added in front of dials 12. This is true of sources 30, lenses 40, and detector 60, as well as circuit board 100 which carries substantially all of the electronic circuitry needed to control the foregoing meter reading operation and other related functions, and heat sink and cover assembly 102 which is mounted over circuit board 100. The arrangement of the apparatus of this invention greatly facilitates mounting on a wide variety of conventional meters and thus makes retrofitting existing meters possible since the meter reading apparatus is basically unchanged.

For monitoring short-term power demand, a reflective sensor assembly 80 is mounted adjacent to one surface of the rotating eddy current disc 16. Sensor assembly 80 monitors the passage of marks spaced along the surface of the disc 16.

Figure 4A:
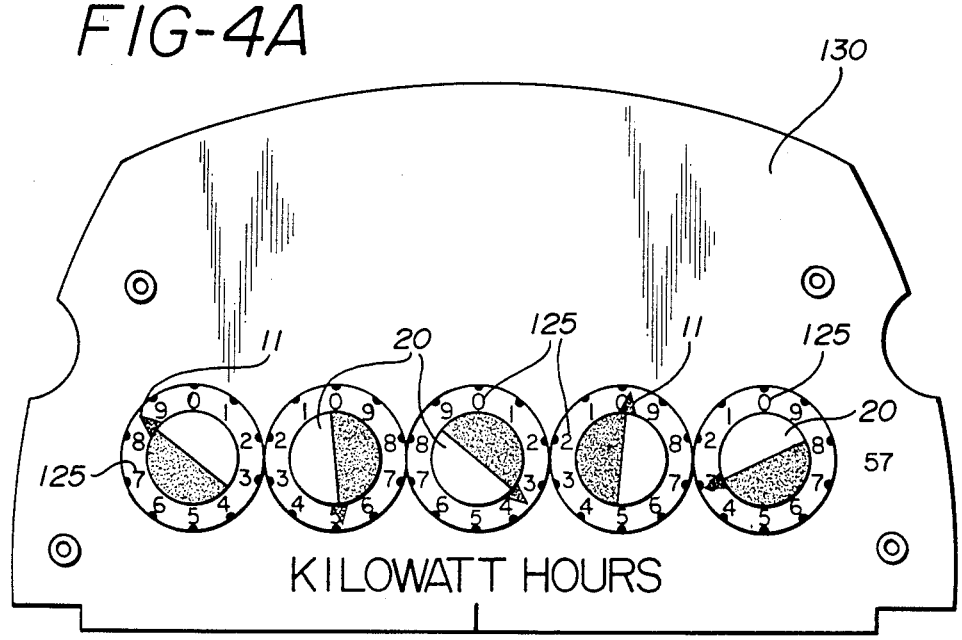
FIG. 4A is a view of a meter face, as seen generally along reference line 4—4 in FIG. 2.
Figure 5:
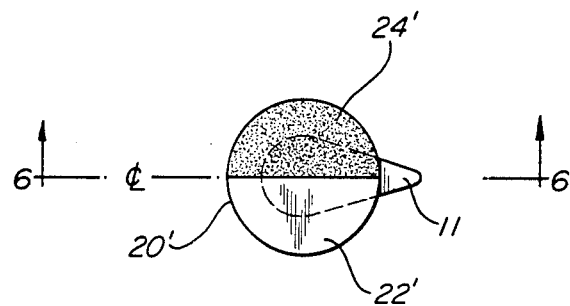
FIG. 5 is plan view of a patterned disc and pointer of the type shown in FIG. 4A.
Figure 6:
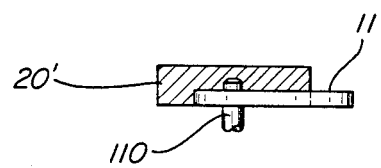
FIG. 6 is a sectional view taken generally along line 6—6 in FIG. 5.

The configuration of control circuitry by which the meter system is controlled and the method by which it communicates energy usage information are disclosed more fully in the above-identified Burrowes patent application Ser. No. 747,243. In that application is disclosed a series of patterned discs 20', shown in FIGS. 4A, 5 and 6, which each include two sectors 22' and 24' differing in reflectivity of the illuminating radiant energy. The sectored detector 60 is capable of detecting the angular orientation of the disc 20' and the pointer 11 carried on shaft 110.

In order to shield the discs 20 of the present invention somewhat from stray light, the meter system 10 is enclosed within a cover 14 which may be made of glass or clear plastic having an opaque interior coating. A portion of the casing 14, however, is free of the opaque coating so as to provide a visual inspection window 115. Window 115, as best shown in FIG. 3, provides clear lines of sight 120 along lines generally oblique with respect to the pointers 11. As a consequence, if pointers 11 are viewed at this angle, it is difficult to visually determine the position of the pointers 11 with respect to the face indicia 125 which surround each of the pointers on face plate 130.

Although in normal operation of the automated meter reading system, visual inspection of the dials is not necessary, such inspection may, from time to time, be advantageous. For example, a malfunction in the circuitry of the system may require that the meter be read by a utility company employee. Additionally, the consumer may be more confident in the automated meter reading system if he is able to read the meter himself.

Figure 4B:
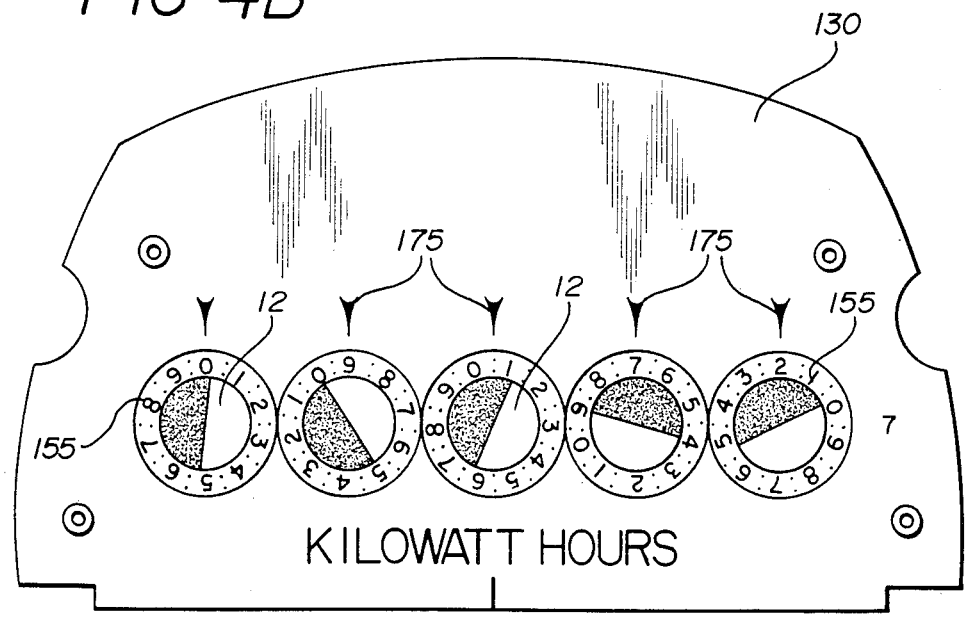
FIG. 4B is a view, similar to FIG. 4A, of a meter face including dials configured according to the present invention.
Figure 7:
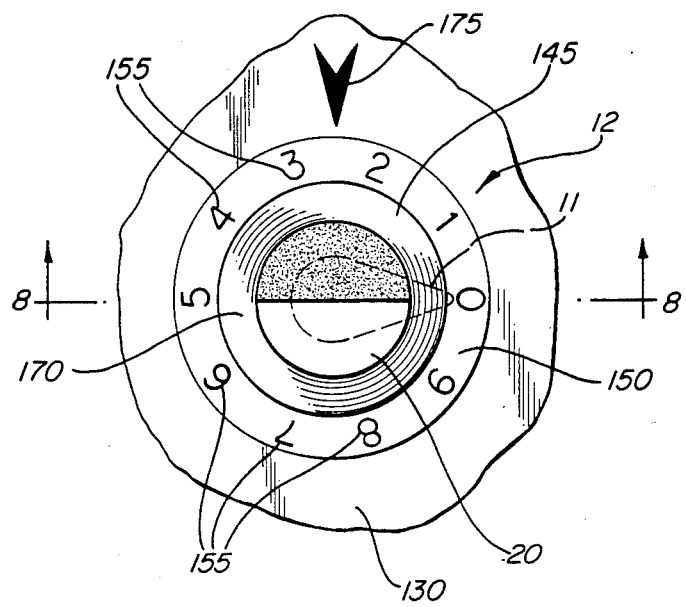
FIG. 7 is a plan view of a dial of the type shown in FIG. 4B.
Figure 8:
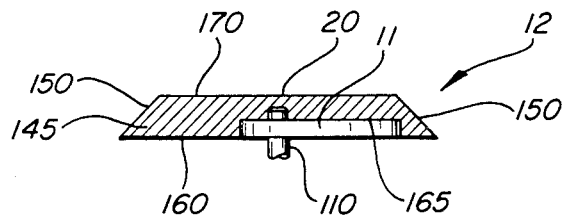
FIG. 8 is a sectional view taken generally along line 8—8 in FIG. 7.

According to the present invention, a dial arrangement is provided which permits the meter means 135 to be read by the noncontact shaft angle detector 140 while at the same time permitting visual inspection of the meter 135 by the consumer through window 115. A dial means 12, illustrated in FIGS. 7, and 8 is mounted on each of the indicator shafts 110, as shown in FIG. 4B. Each such dial means includes a dial body 145 which defines a patterned disc 20 for concentric rotation with the shaft 110, and a beveled circumferential surface 150, extending around the patterned disc 20 and bearing a plurality of numerical indicia 155. The dial means 12 is configured for retrofitting a standard utility meter by defining a mounting surface 160 having a pointer receiving recess 165 therein to facilitate adhesive attachment of the dial body 145 to a pointer 11. The dial body 145 defines a generally flat surface 170 on the side of the body 145 opposite mounting surface 160. The surface 170 carries the patterned disc 20 which provides the optically readable pattern, as discussed above. As is apparent from FIG. 4B, the indicia 155 are arranged in ascending order in a counterclockwise direction around the periphery of some of the dials 12 and in ascending order in a clockwise direction around the periphery of the others of the dials 12. It will be appreciated that this arrangement of indicia will be determined by the direction of rotation of the shaft on which the dial 12 is mounted as power is consumed. As may be noted by comparing FIGS. 4A and 4B, the dials 12 of FIGS. 7 and 8 are sufficiently large so as to cover the face indicia 125 associated with the dial pointers 11, thereby eliminating the necessity of replacing the face plate 130 to remove these indicia during the retrofitting operation.

A plurality of positional indicators 175 are preferably added to the face plate 130 to facilitate visually reading the meter. It will be appreciated that the orientation of the surfaces 150 adjacent the indicators 175 are such as to present the indicia 155 at an angle generally perpendicular to the line of sight 120 and that this further facilitates reading the meter.

If desired, an alternative dial means 12 may be utilized having a generally flat mounting surface. With such a dial means, it is necessary to remove the pointer 11 from associated shaft 10 before the dial 12 is mounted on the shaft. The dial 12 may be attached to the end of the shaft by a press fit, with an adhesive also being used as well, if needed to provide secure mounting.

Having described the invention in detail and by reference to preferred embodiments thereof, it will be apparent that modifications and variations are possible without departing from the scope of the invention defined in the appended claims.

What is claimed is:

1. A utility meter reading system, comprising:
   meter means for measuring the consumption of a metered utility service or commodity by a consumer, said meter means including a plurality of indicator shafts, the angular positions of which indicate service or commodity consumption,
   a plurality of dial means, each such dial means being mounted for rotation on an associated one of said indicator shafts, each such dial means defining
      a patterned disc for concentric rotation with a shaft, and
      a beveled circumferential surface extending around said patterned disc and bearing a plurality of numerical indicia, and
   a noncontact shaft angle detector for detecting the angular positions of said patterned discs, said detector being mounted adjacent said dial means and the angular position of said dial means being viewable with ease from a lateral viewing position by the consumer by virtue of the orientation of the numerical indicia beveled surface.

2. The utility meter reading system of claim 1 in which each of said dial means is adhesively mounted over a dial pointer on an associated one of said indicator shafts, so as to retrofit a utility meter with said plurality of dial means and with said noncontact shaft angle detector.

3. The utility meter reading system of claim 1 in which said patterned disc is diametrically bisected into two sectors of differing optical properties.

4. The utility meter reading system of claim 2 in which said meter means defines a face plate through which said indicator shafts extends and on which a plurality of face indicia are arranged around each of the shafts to indicate the position of the dial pointers carried by the shafts, said dial means having a sufficient outer diameter so as to cover said face indicia.

5. The utility meter reading system of claim 4 in which said face plate carries a positional indicator for each of said dial means to provide an indication of shaft angle positions in conjunction with said plurality of numerical indicia.

6. The utility meter reading system of claim 4 in which at least some of said shafts rotate generally clockwise with increasing consumption and in which said plurality of numerical indicia are arranged in ascending order in a counterclockwise direction around the periphery of said dial means mounted thereon.

7. The utility meter reading system of claim 4 in which at least some of said shafts rotate generally counterclockwise with increasing consumption and in which said plurality of numerical indicia are arranged in ascending order in a clockwise direction around the periphery of said dial means mounted thereon.

8. The utility meter reading system of claim 4 further comprising a cover defining a visual inspection window providing clear lines of sight to said plurality of dial means along lines generally perpendicular to the closest portion of the beveled surfaces of the dial means, whereby said numerical indicia on said dial means may be easily viewed.

9. The utility meter reading system of claim 8 further comprising a positional indicator for each of the dial means on said face plate, whereby the angular position of each of the shafts is defined.

10. The utility meter reading system of claim 9 in which dial means are arranged in a row across said face plate, said window being generally laterally positioned with respect thereto to facilitate visual inspection of said dial means.

11. A dial for retrofitting a utility meter to permit simultaneous detection of the position of an indicator shaft carrying a dial pointer and visual inspection of the position of said indicator shaft, comprising a dial body, defining a mounting surface having a pointer-receiving recess therein for mounting on said dial pointer, said dial body defining a generally flat surface on the side of said body opposite said mounting surface and a beveled surface extending circumferentially therearound, an optically readable pattern on said generally flat surface, and a plurality of numerical indicia on said beveled surface for visual inspection, whereby said optically readable pattern may be read by a noncontact shaft angle detector and said numerical indicia may simultaneously be viewed from a lateral position.

12. The dial of claim 11 in which said numerical indicia are arranged in ascending order in a counterclockwise direction around the periphery of said dial.

13. The dial of claim 11 in which said dial is sufficiently large in diameter so as to cover indicia associated with said pointer.

14. The dial of claim 11 in which said numerical indicia are arranged in ascending order in a clockwise direction around the periphery of said dial.

* * * * *